United States Patent
Wang et al.

(10) Patent No.: US 8,103,931 B2
(45) Date of Patent: Jan. 24, 2012

(54) METHOD FOR CONSTRUCTING LARGE-GIRTH QUASI-CYCLIC LOW-DENSITY PARITY-CHECK CODES

(75) Inventors: Yige Wang, Natick, MA (US); Jonathan S. Yedidia, Cambridge, MA (US); Stark C. Draper, Madison, WI (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 819 days.

(21) Appl. No.: 12/199,512

(22) Filed: Aug. 27, 2008

(65) Prior Publication Data

US 2010/0058139 A1    Mar. 4, 2010

(51) Int. Cl.
*H03M 13/00* (2006.01)
(52) U.S. Cl. ........................ 714/755; 714/786
(58) Field of Classification Search .................. 714/755, 714/786
See application file for complete search history.

(56) References Cited

U.S. PATENT DOCUMENTS

| | | | |
|---|---|---|---|
| 6,633,856 B2 | 10/2003 | Richardson et al. | |
| 2005/0149845 A1 | 7/2005 | Shin et al. | |
| 2006/0109821 A1 | 5/2006 | Xia | |
| 2009/0228771 A1 * | 9/2009 | Shasha | 714/801 |

OTHER PUBLICATIONS

Xiao-Yu Hu et al.; "Regular and Irregular Progressive Edge-Growth Tanner Graphs"; IEEE Trans. Info. Theory, Jan. 2005, pp. 389-398, vol. 51, No. 1.
Marc P. C. Fossorier, "Quasi-Cyclic Low-Density Parity-Check Codes From Circulant Permutation Matrices"; IEEE Trans. Inform. Theory, Aug. 2004, pp. 1788-1793, vol. 50, No. 8.
Zongwang Li et al., "A Class of Good Quasi-Cyclic Low Density Parity Check Codes Based on Progressive Edge Growth Graph," Signals, Systems and Computers, Conference Record of the 38th Asilomar Conference, 2004, pp. 1990-1994, vol. 2, Pittsburgh, PA.
Tom Richardson et al., "The Renaissance of Gallager's Low-Density Parity-Check Codes", IEEE Communications Magazine, Aug. 2003, pp. 126-131, vol. 41.
R.M. Tanner et al., "A Class of Group-Structured LDPC Codes," Proc. International Symposium on Communication Theory and Applications, Ambleside, U.K., Jul. 2001.

* cited by examiner

*Primary Examiner* — Guy Lamarre
(74) *Attorney, Agent, or Firm* — Dirk Brinkman; Gene Vinokur

(57) ABSTRACT

A method constructs a code, wherein the code is a large-girth quasi-cyclic low-density parity-check code. A base matrix is selected for the code. A cost matrix corresponding to the base matrix is determined. A single element in the base matrix is changed repeatedly maximize a reduction in cost. A parity check matrix is constructing for the code from the base matrix when the cost is zero, and an information block is encoded as a code word using the parity check matrix in an encoder.

12 Claims, 4 Drawing Sheets

METHOD FOR CONSTRUCTING LARGE-GIRTH QUASI-CYCLIC LOW-DENSITY PARITY-CHECK CODES

FIELD OF THE INVENTION

The present invention relates generally to error-correcting codes, and more specifically to constructing large-girth quasi-cyclic low-density parity-check (QC-LDPC) codes.

BACKGROUND OF THE INVENTION

Error-Correcting Codes

A fundamental problem in the field of data storage and communication is constructing efficient error-correcting codes. Unless specified otherwise, any reference to a "code" in the following description should be understood to refer to an error-correcting code.

One very important error-correcting code is a linear block error-correcting code.

This code encodes a block of k information symbols using a block of N symbols, where N>k. The additional N−k symbols are used to correct corrupted signals when they are received over a noisy communication channel or retrieved from faulty storage media. The parameter k is called the "dimension" of the code.

A block of N symbols that satisfies all the constraints of the code is called a "code-word," and the corresponding block of k information symbols is called an "information block."

A linear code can be represented by a parity check matrix. The parity check matrix representing a binary [N, k] code is a matrix of zeros and ones, with M rows and N columns. The N columns of the parity check matrix correspond to the N symbols of the code. The number of linearly independent rows in the matrix is N−k.

LDPC Codes

There has recently been a great deal of interest in codes that can be decoded using iterative methods. One particularly important iteratively-decodable code is a low-density parity-check (LDPC) code, first described in 1963 by Gallager, see T. Richardson and R. Urbanke, "The Renaissance of Gallager's Low-Density Parity-Check Codes," IEEE Communications Magazine, vol. 41, pp. 126-131, August 2003, and U.S. Pat. No. 6,633,856 to Richardson et al. on Oct. 14, 2003, "Methods and apparatus for decoding LDPC codes."

Many LDPC codes use random constructions. For example, Gallager's original binary LDPC code is defined in terms of a parity check matrix, which consists only of 0's and 1's, where a small number of 1's are placed randomly within the matrix according to a pre-defined probability distribution. In general, iterative decoders work well for codes with a parity check matrix that has a relatively small number of non-zero entries, whether that parity check matrix has a random or regular construction.

LDPC codes are often represented using "Tanner graphs," which are equivalent to parity check matrices. In a Tanner graph, columns of the parity check matrix are represented as "bit nodes" while rows of the parity check matrix are represented as "check nodes." The Tanner graph is a bi-partite graph that contains a connection between a bit node and a check node if there is a 1 in the parity check matrix at the corresponding row and column position.

QC-LDPC Codes

LDPC codes based on random constructions have the disadvantage that the wiring complexity involved in fabricating a hardware decoder is prohibitive. For this reason, the more regular "quasi-cyclic" LDPC (QC-LDPC) codes have been developed. An example of a QC-LDPC code is described by R. M. Tanner, D. Sridhara, and T. Fuja, "A Class of Group-Structured LDPC Codes," Proc. International Symposium on Communication Theory and Applications, Ambleside, U.K., July 2001, US Patent Publications 20060109821, "Apparatus and method capable of a unified quasi-cyclic low-density parity-check structure for variable code rates and sizes," and US Patent Publication 20050149845 "Method of constructing QC-LDPC codes using $q^{th}$-order power residue."

The regular structure of QC-LDPC codes enables efficient and high-speed very large scale integration (VLSI) implementations. For this reason, a number of wireless communications standards use QC-LDPC codes, e.g., the IEEE 802.16e, 802.11n standards and DVB-S2 standards.

In general, QC-LDPC codes are in the form of a parity-check matrix H that has a special structure, which makes the codes very convenient for hardware implementation. The parity check matrix is constructed out of square p×p sub-matrices. These sub-matrices either consist of all zeroes, or they are circulant permutation matrices.

Circulant permutation matrices are matrices with a single 1 in each row, where the column in which the 1 is located is shifted by one from row to row. The following matrix is an example of a circulant permutation matrix with p=6:

$$I(2) = \begin{pmatrix} 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ 1 & 0 & 0 & 0 & 0 & 0 \\ 0 & 1 & 0 & 0 & 0 & 0 \end{pmatrix}. \quad (1)$$

This matrix is called "I(2)" because when the rows and columns are counted starting at position 0, the 1 in the $0^{th}$ row is in column 2. The permutation matrix I(0) is the identity matrix. If the value of the index t in I(t) is greater than or equal to p, then the matrix wraps around, so that for p=6, we have I(2)=I(8)=I(14) etc. One special notation that is generally used in describing QC-LDPC codes, and which is used herein, is that the p×p all-zeroes matrix is denoted I(−1).

A (J, L) QC-LDPC code with sub-matrices of size p×p is defined by its parity check matrix $$H = \begin{bmatrix} I(p_{0,0}) & I(p_{0,1}) & \ldots & I(p_{0,L-1}) \\ I(p_{1,0}) & I(p_{1,1}) & \ldots & I(p_{1,L-1}) \\ \vdots & \vdots & \ddots & \vdots \\ I(p_{J-1,0}) & I(p_{J-1,1}) & \ldots & I(p_{J-1,L-1}) \end{bmatrix}, \quad (2)$$

where $0 \leq j \leq J-1$, $0 \leq l \leq L-1$, and $p_{j,l}$ is an integer in the range $-1 \leq p_{j,l} \leq p-1$. For a parity check matrix of size M by N, N=pL and m=pJ.

A specific QC-LDPC parity check matrix can be constructed form a corresponding J×L dimensional base matrix B. The entries in the base matrix are the values $p_{j,l}$ for the corresponding entry of the parity check matrix:

$$B = \begin{bmatrix} p_{0,0} & p_{0,1} & \cdots & p_{0,L-1} \\ p_{1,0} & p_{1,1} & \cdots & p_{1,L-1} \\ \vdots & \vdots & \ddots & \vdots \\ p_{J-1,0} & p_{J-1,1} & \cdots & p_{J-1,L-1} \end{bmatrix}. \quad (3)$$

When all-zeroes sub-matrices are used, the resulting LDPC code can be an "irregular" LDPC code. An irregular LDPC code is one for which different columns or rows in the parity check matrix can contain different numbers of ones.

Girth of LDPC Codes

Depending on the application, LDPC codes are designed to optimize performance in either the "water-fall" (SNR near the code threshold) or "error-floor" (higher SNR) regime, or both. Low error floors are particularly important for applications that have extreme reliability demands, such as data storage devices and communication systems.

Some theoretical analyses of error floor problems for LDPC codes argue that error events are caused by "trapping sets," see for example, T. J. Richardson, "Error Floors of LDPC Codes," Proc. 41$^{st}$ Annual Allerton Conference on Communications, Control, and Computing 2003. Trapping sets result from clusters of short cycles in the Tanner graph of the code. One way to remove trapping sets that involve short cycles is to carefully design the clustering of short cycles in the Tanner graph.

A simpler approach uses codes with larger girths. The "girth" of a code is the length of a shortest cycle in the code graph. By removing short cycles, a large number of cycles are removed, which has the effect of lowering (improving) the error floor.

There is considerable prior art on optimizing girth in LDPC codes. One code uses a progressive-edge growth (PEG) method, see X. Y. Hu, E. Eleftheriou, and D. M. Arnold, "Regular and Irregular Progressive Edge-Growth Tanner Graphs," IEEE Trans. Info. Theory, vol. 51, pp. 386-398, 2005.

There has also been work on applying the PEG method to QC-LDPC codes, see Z. Li, B. V. K. V. Kumar, "A Class of Good Quasi-cyclic low-density parity-check Codes Based on Progressive Edge Growth Graph," Signals, Systems, and Computers, Conference Record of the 38$^{th}$ Asilomar Conference, vol. 2, pp. 1990-1994, 2004.

High-girth QC-LDPC codes can also be constructed using a random "guess-and-test" method, see M. P. C. Fossorier, "Quasi-cyclic low-density parity-check codes from circulant permutation matrices," IEEE Trans. Inform. Theory, vol. 50, no. 8, pp. 1788-1793, August 2004.

However, there is room for improvement in those methods, in terms of the girth that can be achieved for a code of particular block-length and dimension. Therefore, an improved method for constructing high-girth QC-LDPC codes is desired.

SUMMARY OF THE INVENTION

The embodiments of the invention provide a method for constructing high-girth quasi-cyclic low-density parity-check (QC-LDPC) codes. The method uses a hill-climbing optimization procedure. The hill-climbing procedure greedily adjusts parameters of the code to find a code of short length that meets specified code and girth parameters.

Given a girth, the method can construct QC-LDPC codes of shorter block-length in less time compared with a prior art PEG or "guess-and-test" methods. The time difference is significant for QC-LDPC codes with large base matrices.

DETAILED DESCRIPTION OF THE PREFERRED EMBODIMENTS

Figure 1:
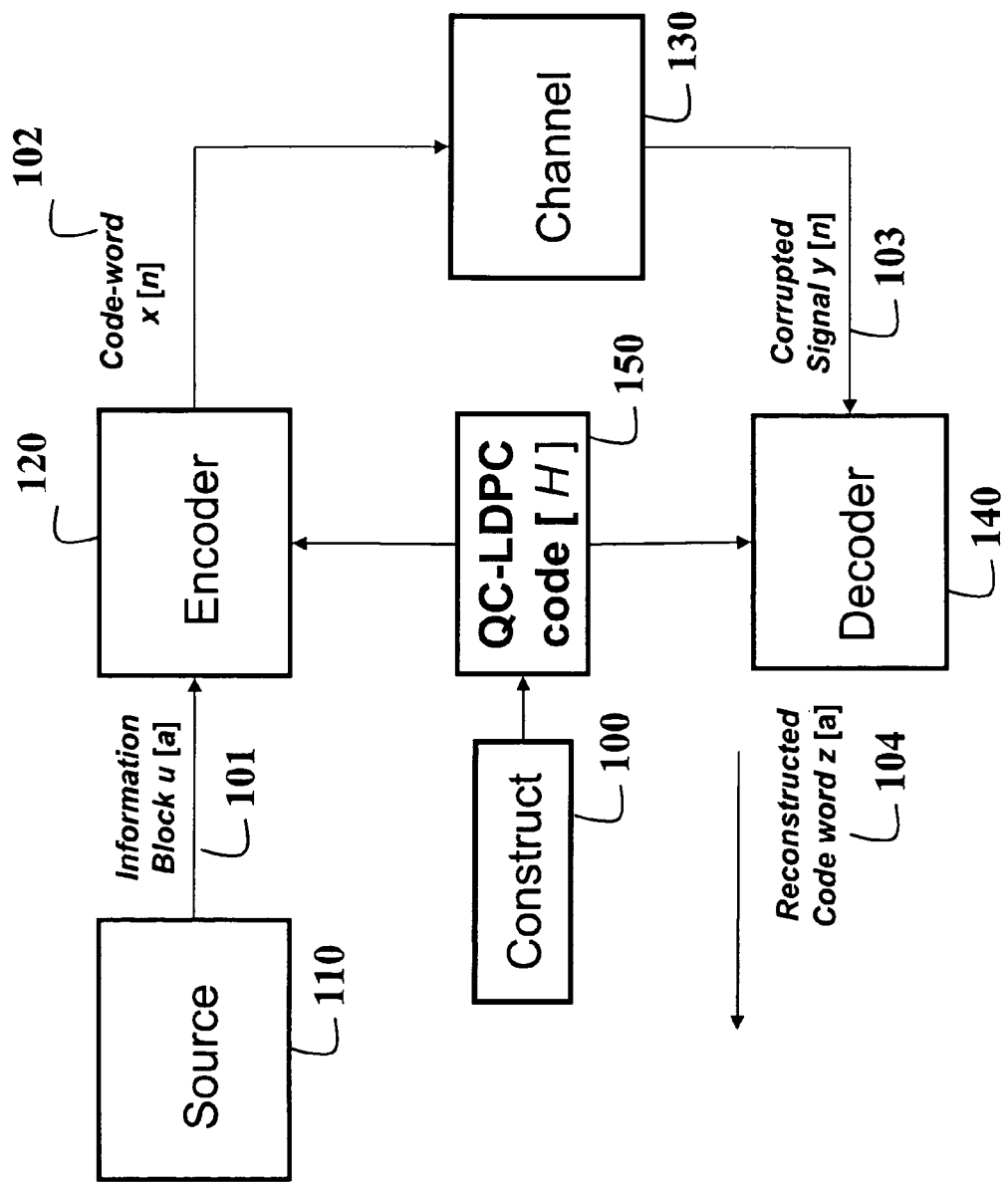
FIG. 1 is a flow diagram of a method for encoding and decoding information using a QC-LDPC code according to embodiments of the invention.

As shown in FIG. 1, the embodiments of the invention provide a method for constructing 100 a quasi-cyclic low-density parity-check (QC-LDPC) code 150 with a high girth. Such a code can then be used to encode 120 an information block 101 of k symbols u[a] generated by a source 110. The encoded information is transmitted through a noisy channel 130 as a code-word x[n] 102 including N symbols. The channel can be a communications channel. The "channel" can also be storage media. In this case, the code-word is written to the media for later retrieval.

It is possible for the channel to corrupt the code-word to a signal y[n] 103. The signal is then passed to a decoder 140, which attempts to output a reconstruction z[a] 104 of the information block u[a] 102 using the QC-LDPC code 150.

Finding Cycles in QC-LDPC Codes

Figure 2:
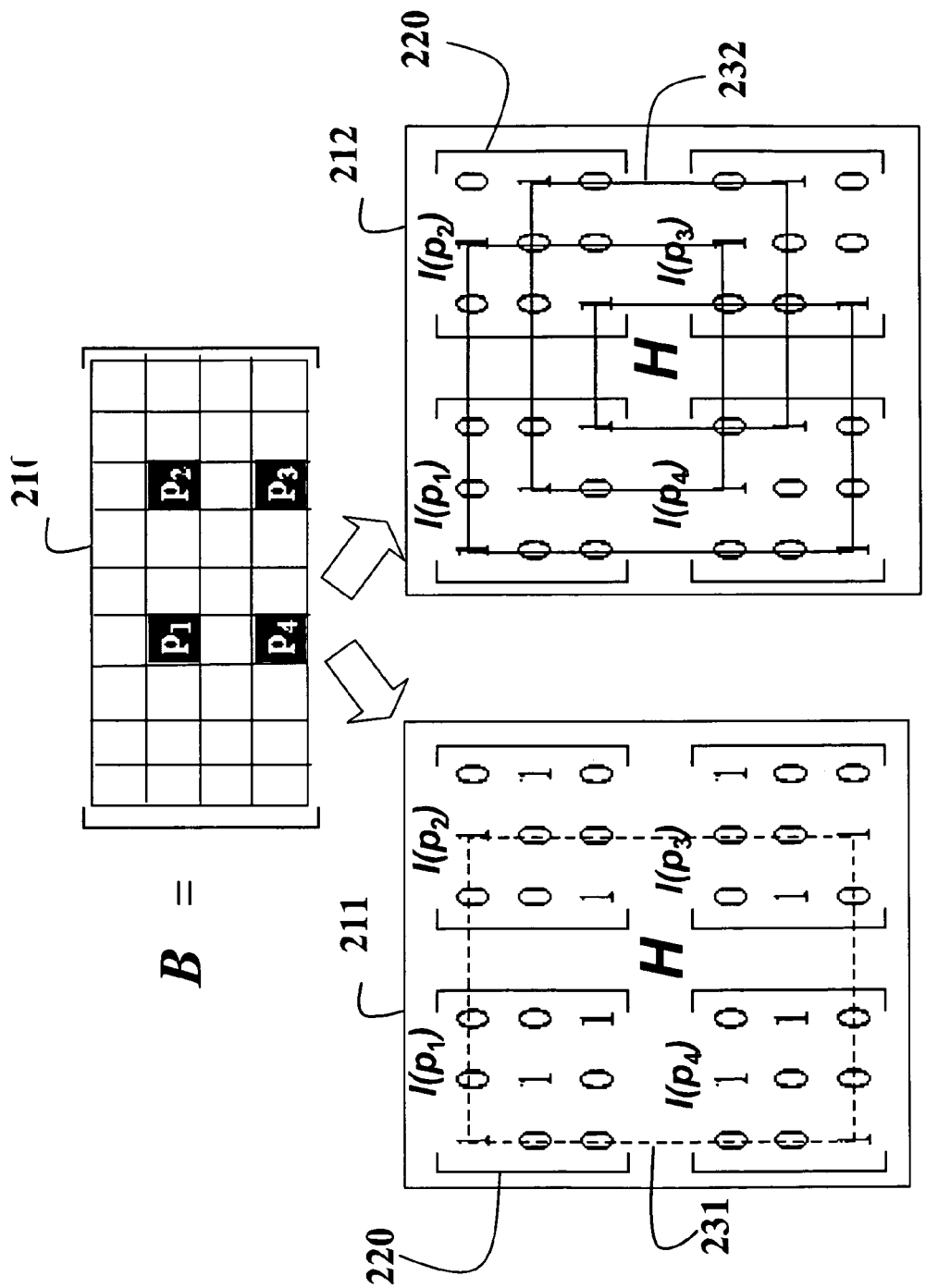
FIG. 2 is a flow diagram of a base matrix and possible permutation matrices according to embodiments of the invention.

FIG. 2 shows cycles in a Tanner graph for a given base matrix B 200. To understand our invention, it helps to understand how cycles in the Tanner graph can be identified. We show a 9×6 base matrix B 210 and four parameters $p_1$, $p_2$, $p_3$, and $p_4$. Two possible corresponding parity check matrices H 211 and 212 are also shown. Each parity check matrix has with four 3×3 circulant permutation sub-matrices 220 for the associated parameters $p_1$, $p_2$, $p_3$, and $p_4$ of the base matrix. The two possible choices for the parameters of these four matrices are:

$p_1=0$, $p_2=1$, $p_3=2$ and $p_4=1$ in the matrix 211, and
$p_1=0$, $p_2=p_3=p_4=1$ in the matrix 212.

The first subgraph results in cycles of length four, as shown with dashed lines 231, while the latter results in a cycle 232 of length twelve.

We now describe a correspondence between a choice of shifts and the length of a resulting cycle in the Tanner graph of the code. Each row of the parity-check matrix corresponds to a check node in the Tanner graph, and each column to a bit node in the Tanner graph. Cycles correspond to a path through nodes, alternating between check and bit nodes.

As shown in FIG. 2, a path through nodes can be visualized as rectilinear moves. A horizontal move along a row corresponds to selecting two edges connected to the same parity-check that form part of the path. A vertical move along a column corresponds to selecting a second edge connected to the same bit node that forms the next step in the path.

For a cycle, the path ends at the same bit node from which the path started. It is necessary, but not sufficient, for the path, when viewed at the base matrix level, to form a cycle. In other words, it is required that the path does not pass through any all-zeroes sub-matrices, denoted in the base matrix by a −1. We assume that potential paths satisfy this condition. However, because each circulant permutation sub-matrix corresponds to p parity nodes and p variable nodes, this is not sufficient.

The path could end at a different bit node in the same circulant permutation sub-matrix, thus not completing a cycle. What is sufficient is if, when the path returns, it returns to the same column of the circulant sub-matrix from which the path started. For example, in the subgraph 201, this happens for a cycle of length four. However, with a slightly different choice of circulant shifts of the subgraph 202, this only happens after a cycle of length twelve.

We can now specify the conditions on the parameter $p_{j,l}$ that result in a cycle. We determine the differences between the $p_{j,l}$ for neighboring permutation matrices along a given path, where neighbors are on the same row. In FIG. 2, these are $p_2-p_1$ and $p_4-p_3$. Alternatively, we can describe this in terms of differences along columns. Each difference corresponds to the shift in the column of the permutation matrix through which the path passes. Only if the differences sum to zero (mod–p) at the end of the path does the path return to the same variable node in the starting permutation matrix, thereby defining a cycle. For the example of FIG. 2, for a length-four cycle to exist the condition is:

$$p_1 - p_2 + p_3 - p_4 \bmod p = 0, \quad (4)$$

which is satisfied for $p_1=0$, $p_2=1$, $p_3=2$, $p_4=1$, but is not satisfied for $p_1=0$, $p_2=p_3=p_4=1$. Each cycle in the QC-LDPC code is necessarily related to p−1 other cycles obtained by the p−1 possible cyclic shifts in the circulant sub-matrices.

The same logic extends to longer cycles. As for a four-cycle pass through four elements of the base matrix arranged in a rectangle, an arbitrary cycle of length 2i in the Tanner graph of the code passes through 2i elements of the base matrix denoted by the ordered series $$(j_0,l_0), (j_1,l_0), (j_1,l_1), \ldots, (j_{i-1},l_{i-1}), (j_0,l_{i-1}), \quad (5)$$

where $1 \leq k < i$, $j_k \neq j_{k-1}$, $l_k \neq l_{k-1}$, $j_i - 1 \neq j_0$, and $l_{i-1} \neq l_0$. This ordered series can be considered a "potential" cycle of length 2i. Actually, the series only corresponds to a cycle if the elements traversed in the base matrix satisfy the generalization of Equation (4). To define this generalization, we use the following notation. We define $$\Delta_{j_x,j_y}(l) = p_{j_x,l} - p_{j_y,l}.$$

A necessary and sufficient condition for the code to have girth of at least 2(i+1) is that $$\sum_{k=0}^{m-1} \Delta_{j_k,j_{k+1}}(l_k) \neq 0 \bmod p \quad (6)$$

for all m, $2 \leq m \leq i$, all $j_k$, $0 \leq j_k \leq J-1$, all $j_{k+1}$, $0 \leq j_{k+1} \leq J-1$, and all $l_k$, $0 \leq l_k \leq L-1$, with $j_0 = j_m$, $j_k \neq j_{k+1}$, and $l_k \neq l_{k+1}$.

For every dimension pair (J, L) and girth g (minimum-length cycle of graph), there exists a $p_{min}$ (or equivalently $N_{min}$), such that when $p < p_{min}$ or $N < N_{min}$, no parity check matrices exists that satisfies Equation (6).

We provide a method that constructs a high girth QC-LDPC code of dimensions (J, L), and a girth g. The method returns a base matrix B and a value of p such that the specified code constructed from the base matrix has the girth and p is equal to $p_{min}$, or at least as close as possible to $p_{min}$.

One prior art method uses a "guess-and-test" method, see Fossorier, "Quasi-cyclic low-density parity-check codes from circulant permutation matrices," IEEE Trans. Inform. Theory, vol. 50, no. 8, pp. 1788-1793, August 2004. For the guess-and-test method, (J−1)(L−1) integers between 0 and p−1 are randomly and independent identically distributed for non-zero elements of the base matrix B until a set is found such that Equation (6) is satisfied.

Fossorier shows that for codes of girth 8 or larger, all non-zero values in the base matrix must be distinct. We consider his method for those girths to be one where the (J−1)(L−1) integers are selected randomly in the range from 1 to p−1, such that all the integers are distinct. The problem with the guess-and-test method is that it is time-consuming, especially for large base matrices and where N is close to $N_{min}$.

Hill-Climbing Optimization Procedure

Our method is a "hill-climbing" optimization procedure. Hill climbing is an optimization technique that can be used to solve problems that have many solutions but where some solutions are better than others. The procedure starts with a random initial solution to the problem, and iteratively makes small changes to improve the solution.

We start with a randomly selected base matrix B. We also have a corresponding cost matrix C of costs. Then, we change the base matrix B by making a "move." The move changes the value of a single element (a $p_{j,l}$) in the base matrix. We select the move that maximizes a reduction in the costs. The costs are a function of the number of cycles of length less than the girth that remain in the base matrix B.

When we no longer can change any single value of the base matrix to a value that further reduces the costs, and thus the number of undesired shorter cycles, the method terminates.

The procedure uses local hill-climbing where the cost function defined by the cost matrix C is the weighted sum of undesired cycles, and cycles of different weights have different weights in the cost function.

Our method tracks the number of cycles of each length in the current code, and the resulting number of cycles if we change each possible element in the base matrix B to other possible values.

The method becomes more complicated when we search for codes with large girths, because of the many possible ways that cycles can form in the Tanner graph.

Cost Matrix

The cost matrix C indicates the costs of changing any value in the base matrix B to have any other possible value, in terms of the weighted sum of the number of cycles. Thus, for any base matrix B, there is a corresponding cost matrix $$C = \begin{bmatrix} c_{0,0} & c_{0,1} & \cdots & c_{0,L-1} \\ c_{1,0} & c_{1,1} & \cdots & c_{1,L-1} \\ \vdots & \vdots & \ddots & \vdots \\ c_{J-1,0} & c_{J-1,1} & \cdots & c_{J-1,L-1} \end{bmatrix}, \quad (7)$$

where $c_{j,l} = [c_{j,l,0}, c_{j,l,1}, \ldots, c_{j,l,p-1}]$ is a cost, and $c_{j,l,z}$ is the cost for assigning element $p_{j,l}$ in the base matrix B to the value z for $0 \leq z \leq p-1$.

Let $S_i$ denote the set of all possible and distinct length-2i potential cycles represented by the ordered series, and $|S_i|$ denote the number of all the elements in the set $S_i$. Therefore $S_i = \{s_{i1}, s_{i2}, \ldots, s_{i|S_i|}\}$ with $$s_{ik}[(j_0^{(k)}, l_0^{(k)}), (j_1^{(k)}, l_0^{(k)}), (j_1^{(k)}, l_1^{(k)}), \ldots, (j_{i-1}^{(k)}, l_{i-1}^{(k)}), (j_0^{(k)}, l_{i-1}^{(k)})]$$

for $1 \leq k \leq |S_i|$. The girth is g, and a weight vector is $w = [w_2, w_3, \ldots, w_{g/2-1}]$, where $w_i$ is the weight or cost for length-2i cycles.

For the base matrix, the corresponding cost matrix C is based on the following. For each potential cycle, we go through each of the elements of the base matrix in the potential cycle. We check, for each element, which value would cause a cycle, assuming all other base matrix elements in the potential cycle remain the same, and we mark that value of the element.

For example, for a potential six-cycle, we know that a cycle exists if and only if $p_1-p_2+p_3-p_4+p_5-p_6 \bmod p=0$, where $p_1$ through $p_6$ are the elements of the potential six-cycle. So, if the current summed value of $p_1-p_2+p_3-p_4+p_5-p_6 \bmod p$ is 1, then we know that the marked values for $p_1$, $p_3$, and $p_5$ are one less than the current value, and the marked values for $p_2$, $p_4$, and $p_6$ are one greater than the current value.

This is relatively uncomplicated for potential cycles including 2i distinct elements of the base matrix. It becomes more complicated if some elements of the base matrix in the potential cycle appear twice. This can occur for cycles of size eight and larger and occurs, e.g., in the subgraph 202 of FIG. 2. In such cases, when a value of an element changes, the contribution to the alternating sum doubles, or triples in the length-12 cycle 232 of FIG. 2, because the path in the base matrix passes through an element three times. Therefore, finding the values to mark becomes more complicated. In fact, there can be more than one marked value for a twice-repeating element if p is even and the current value of the alternating sum is even. On the other hand, there may be no marked values for a twice-repeating element if p is even and the current value of the alternating sum is odd.

Formally, we determine the cost matrix as follows.

Step 1

Determine the cost matrix $c_{j,l,z}=0$ for $0 \leq j \leq J-1$, $0 \leq l \leq L-1$, and $0 \leq z \leq p-1$.

Step 2

For $2 \leq i \leq g/2-1$, i. Set $x^{(i)}_{j,l,z}=0$ for $0 \leq j \leq J-1$, $0 \leq l \leq L-1$, and $0 \leq z \leq p-1$, where $x^{(i)}_{j,l,z}$ is a count of the number of cycles of length 2i that would result if base matrix element $p_{j,l}$ has value z.

ii. For $1 \leq k \leq |S_l|$, determine the alternating sum:

$$\alpha = \left[ \sum_{e=0}^{2i-1} (-1)^e \cdot p_{j^{(k)}_{\lfloor(e-(-1)^e+1)/2\rfloor}, l^{(k)}_{\lfloor e/2 \rfloor}} \right] \bmod p.$$

iii. For $0 \leq e \leq 2i-1$, if $\left( j^{(k)}_{\lfloor(e-(-1)^e+1)/2\rfloor}, l^{(k)}_{\lfloor e/2 \rfloor} \right)$ is unique in $s_{ik}$, then determine the marked value $$\beta = \left[ p_{j^{(k)}_{\lfloor(e-(-1)^e+1)/2\rfloor}, l^{(k)}_{\lfloor e/2 \rfloor}} - (-1)^e \cdot \alpha \right] \bmod p.$$

iv. If $\left( j^{(k)}_{\lfloor(e-(-1)^e+1)/2\rfloor}, l^{(k)}_{\lfloor e/2 \rfloor} \right)$ is not unique in $s_{ik}$ and occurs for the first time, and $\alpha \bmod 2=0$, determine the marked value $$\beta = \left[ p_{j^{(k)}_{\lfloor(e-(-1)^e+1)/2\rfloor}, l^{(k)}_{\lfloor e/2 \rfloor}} - (-1)^e \cdot \alpha \right] \bmod p.$$

v. If $\left( j^{(k)}_{\lfloor(e-(-1)^e+1)/2\rfloor}, l^{(k)}_{\lfloor e/2 \rfloor} \right)$ is not unique in $s_{ik}$ and occurs for the first time, and $(p-\alpha) \bmod 2=0$, then determine the additional marked value $$\beta = \left[ p_{j^{(k)}_{\lfloor(e-(-1)^e+1)/2\rfloor}, l^{(k)}_{\lfloor e/2 \rfloor}} + (-1)^e \cdot (p-\alpha)/2 \right] \bmod p.$$

vi. In each of the above three cases, increment $$x^{(i)}_{j^{(k)}_{\lfloor(e-(-1)^e+1)/2\rfloor}, l^{(k)}_{\lfloor e/2 \rfloor}, \beta} = x^{(i)}_{j^{(k)}_{\lfloor(e-(-1)^e+1)/2\rfloor}, l^{(k)}_{\lfloor e/2 \rfloor}, \beta} + 1.$$

Step 3

For $0 \leq j \leq J-1$, $0 \leq l \leq L-1$, and $0 \leq z \leq p-1$, take the weighted sum $$c_{j,l,z} = \sum_{i=2}^{g/2-1} x^{(i)}_{j,l,z} \cdot w_i.$$

With this method for determining the cost matrix, the hill-climbing method is relatively straightforward to describe.

We start with a random base matrix B and a corresponding cost matrix C, and keep selecting the move of changing a value of a single base matrix element that maximizes the reduction in the costs while breaking ties randomly, until we find a base matrix and the corresponding cost matrix that has a zero cost for each of the current values of the elements of the base matrix. At this point, we return the base matrix B, or if we end in a local optimum, which has positive costs, we indicate a failure condition.

Figure 3:
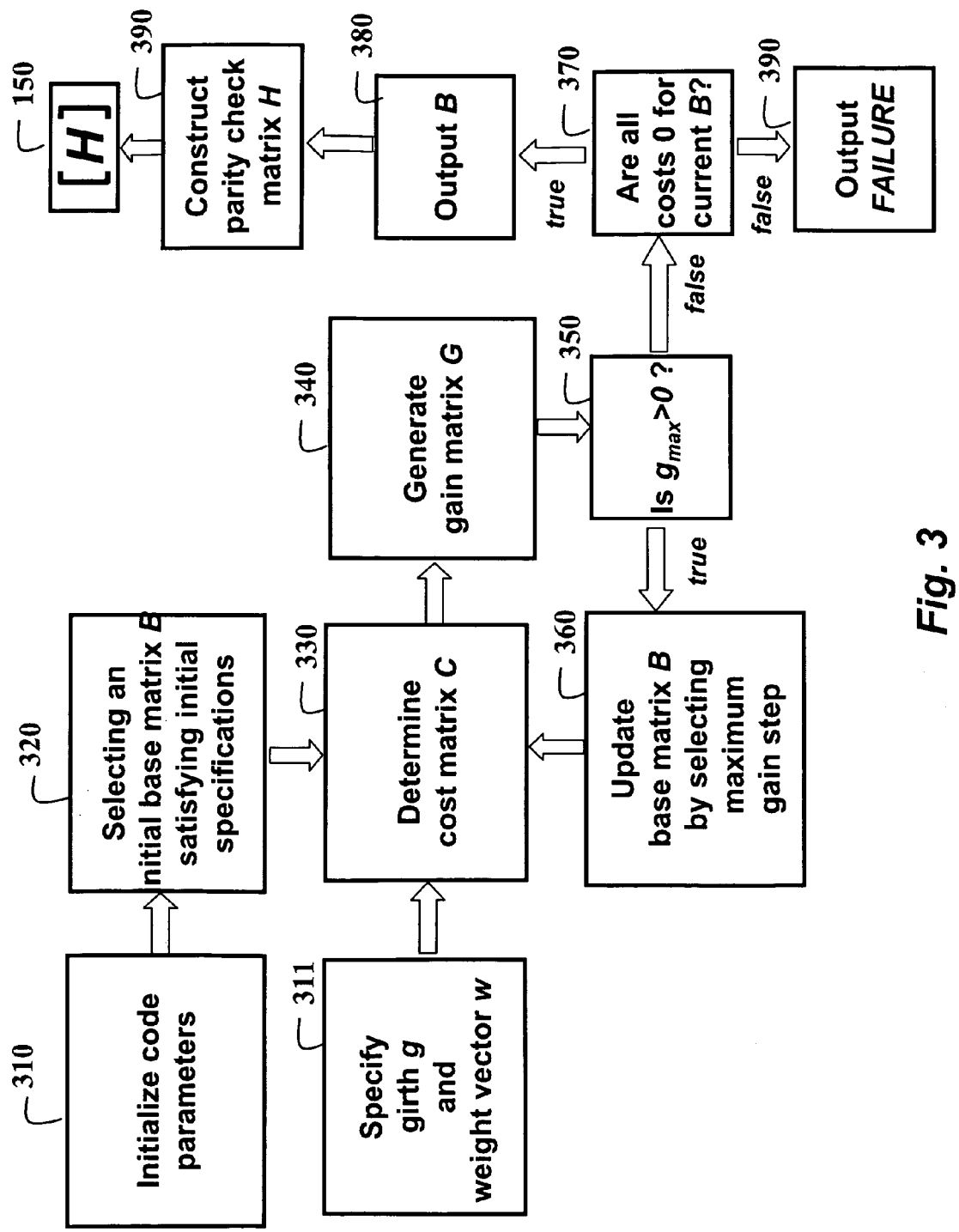
FIG. 3 is a flow diagram of a method for constructing quasi-cyclic low-density parity-check codes with high girth according to embodiments of the invention.

FIG. 3 shows our method in detail. We initialize 310 parameters of the QC-LDPC code. The parameters include the J and L dimensions of a base matrix B, a size of sub-matrices p of the base matrix B, and positions of all-zero sub-matrices in the base matrix B.

We specify 311 the girth g and a weight vector $w=[w_2, w_3, \ldots, w_{g/2-1}]$. The weight vector w has a weight for each type of cycle having a length less than the girth g. The weight vector represents the "costs" of different types of cycles.

We randomly select 320 an initial base matrix B according to the initial parameters of the code.

We determine 330 a cost matrix C corresponding to the base matrix B and the specified girth g and weight vector w. This step was described in detail above.

We generate 340 a gain matrix G using the cost matrix C. For $0 \leq j \leq J-1$ and $0 \leq l \leq L-1$, let $$\tilde{c}_{j,l} = \min_{z: 0 \leq z \leq p-1} c_{j,l,z}$$

-continued $$\tilde{z}_{j,l} = \underset{z: 0 \leq z \leq p-1}{\operatorname{argmin}} c_{j,l,z}$$

and $$c'_{j,l} = c_{j,l,p_{j,l}}$$

Here, $\tilde{c}_{j,l}$ is a minimum possible cost at position j, l in the base matrix B, $\tilde{z}_{j,l}$ is the value of the element $p_{j,l}$ giving that cost, and $c'_{j,l}$ is the cost associated with the current value of the element $p_{j,l}$. The gain matrix $G=[g_{j,l}]$ is generated as $$g_{j,l} = c'_{j,l} - \tilde{c}_{j,l}.$$

The gain matrix represents the value of a best move of an element at each position j, l in the base matrix.

Next, we determine $$g_{max} = \underset{(j,l): 0 \leq j \leq J-1, 0 \leq l \leq L-1}{\max} g_{j,l}$$

$$(j_{max}, l_{max}) = \underset{(j,l): 0 \leq j \leq J-1, 0 \leq l \leq L-1}{\operatorname{argmax}} g_{j,l}.$$

If there are multiple elements j, l, which all achieve the same maximal gain, ties are broken randomly. We check 350 whether the maximum gain $g_{max}$ is positive.

If true, we update 360 the base matrix B by selecting a maximum gain step $p_{jmax,lmax} = \tilde{z}_{jmax,lmax}$ and repeat the step of determining 330 the cost matrix C.

Otherwise if false, we check 370 if all the costs $c_{j,l,p_{j,l}}$ are zero for all $0 \leq j \leq J-1$ and $0 \leq l \leq L-1$. If true, we have the desired base matrix B for the QC-LDPC code that satisfies all our requirements and we output 380 the current base matrix B. Otherwise, if false, we output FAILURE 390. The parity check matrix H for the QC-LDPC code 101 is constructed 390 from the base matrix B.

Then, the QC-LDPC code, i.e., the parity check matrix H 150, can be used in an encoder to encode 120 the information block u[a] to be transmitted through the channel 130 to the decoder, and to reconstruct the information block. The encoded information block can also be written to storage media for later retrieval.

Figure 4:
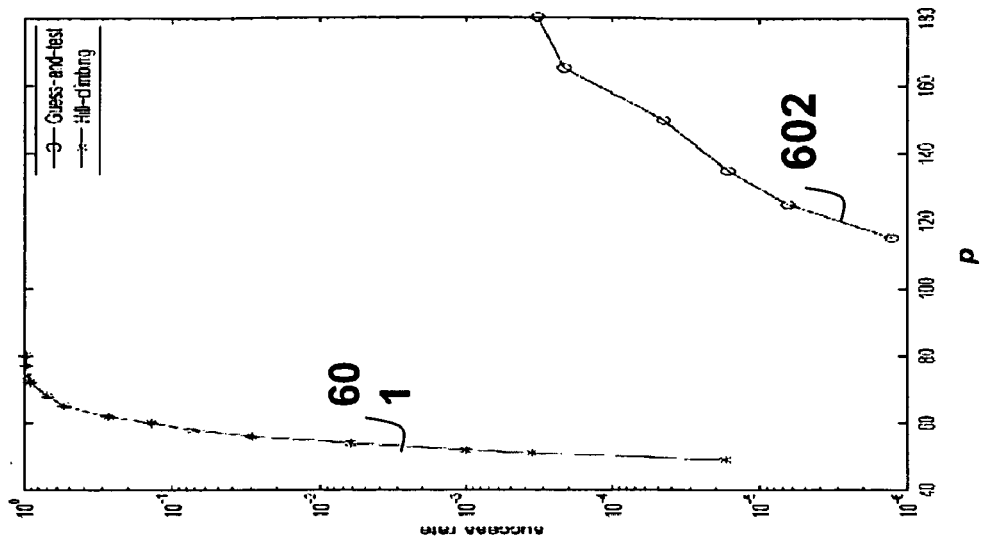
FIGS. 4-6 are graphs comparing QC-LDPC codes constructed by our hill-climbing optimization procedure the prior art guess-and-test method.
Figure 5:
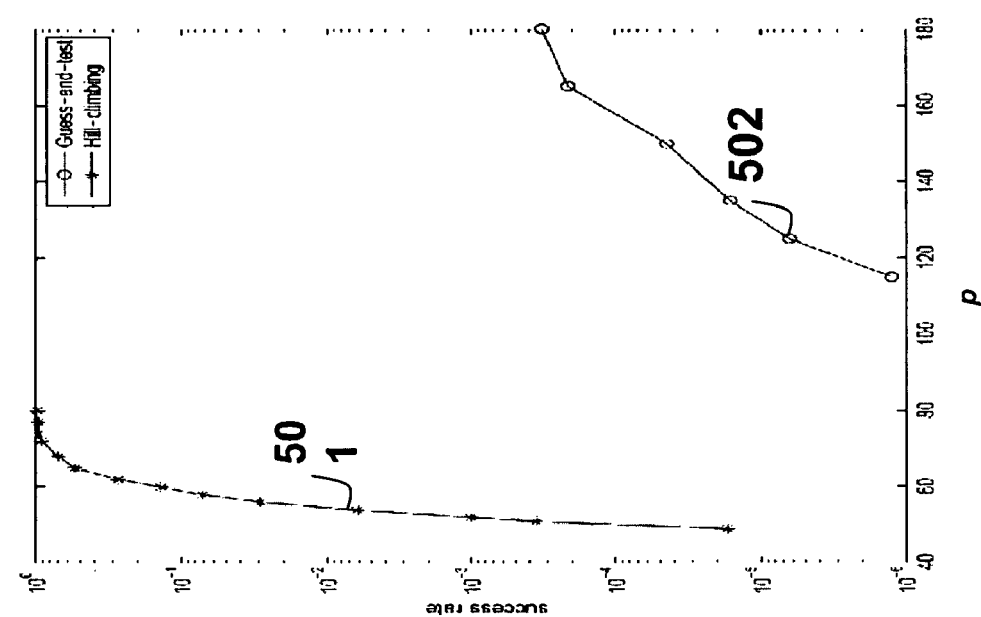
Figure 6:
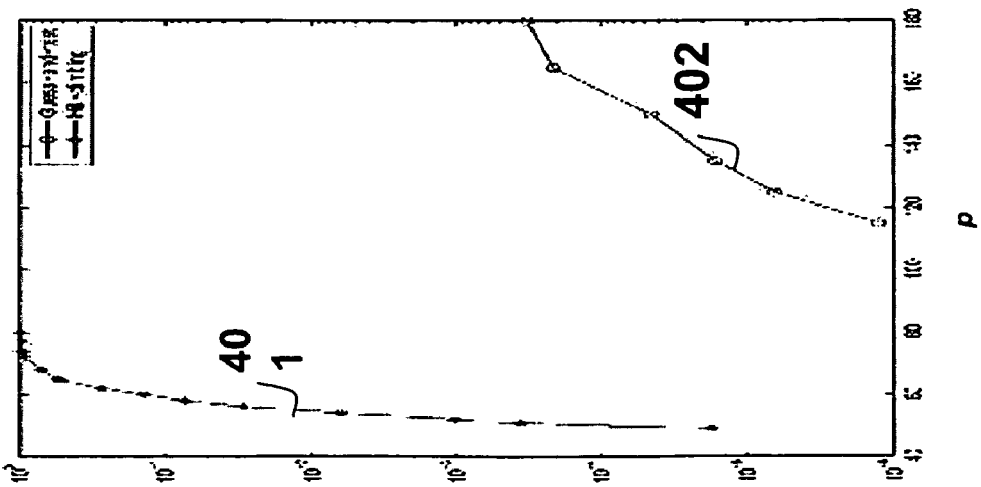

The graphs in FIGS. 4-6 compare the hill-climbing method with the Fossorier guess-and-test method as a function of success rate and circulant matrix size p, for J=3, L=9, g=8 (401 for our hill-climbing, 402 for Fossorier's guess-and-test), J=3, L=12, g=8 (501 for hill-climbing, 502 for guess-and-test), and J=3, L=9, g=10 (601 for hill-climbing, 602 for guess-and-test), respectively. As L and g increase, the success rate of our hill-climbing becomes increasingly superior to that of the prior art guess-and-test.

As shown in the graphs that success rate is at least three orders of magnitude greater than the prior art method.

It is to be understood that various other adaptations and modifications can be made within the spirit and scope of the invention. Therefore, it is the object of the appended claims to cover all such variations and modifications as come within the true spirit and scope of the invention.

We claim:

1. A method for constructing a code, wherein the code is a quasi-cyclic low-density parity-check code, comprising the steps of:
    selecting a base matrix for the code;
    determining a cost matrix corresponding to the base matrix;
    changing repeatedly a single element in the base to maximize a reduction in cost;
    constructing a parity check matrix for the code from the base matrix when the cost is zero; and
    encoding an information block as a code word using the parity check matrix in an encoder.

2. The method of claim 1, wherein the changing uses a hill climbing procedure.

3. The method of claim 1, wherein the base matrix initialized according to parameters.

4. The method of claim 3, wherein the base matrix is selected randomly based on the parameters.

5. The method of claim 1, wherein the cost matrix is determine according to a girth of the code and a weight vector based on cycles of the code.

6. The method of claim 5, wherein the cost is a function of the number of the cycles having a length less than the girth.

7. The method of claim 6, wherein cost is based on a weighted sum of undesired cycles.

8. The method of claim 1, further comprising:
    generating a gain matrix using the cost matrix and the reduction uses a maximum positive gain in the gain matrix.

9. The method of claim 1, wherein the cost matrix indicates the cost of changing any value in the base matrix to any other possible value.

10. The method of claim 1, wherein the channel is a communications channel.

11. The method of claim 1, wherein the channel includes writing the encoded information block on storage media for later retrieval and decoding.

12. The method of claim 1, further comprising:
    transmitting the code word through a channel; and
    decoding the code word in a decoder to recover the information block.

* * * * *